(12) United States Patent
Eimitsu

(10) Patent No.: US 11,979,162 B2
(45) Date of Patent: May 7, 2024

(54) SEMICONDUCTOR DEVICE, RECEPTION DEVICE, AND MEMORY CONTROLLER

(71) Applicant: Kioxia Corporation, Tokyo (JP)

(72) Inventor: Masatomo Eimitsu, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 42 days.

(21) Appl. No.: 17/695,043

(22) Filed: Mar. 15, 2022

(65) Prior Publication Data

US 2023/0085823 A1    Mar. 23, 2023

(30) Foreign Application Priority Data

Sep. 17, 2021   (JP) .................................. 2021-152613

(51) Int. Cl.
*H03L 7/08* (2006.01)
*H03L 7/089* (2006.01)
*H03L 7/099* (2006.01)

(52) U.S. Cl.
CPC ............ *H03L 7/0807* (2013.01); *H03L 7/089* (2013.01); *H03L 7/0895* (2013.01); *H03L 7/0991* (2013.01)

(58) Field of Classification Search
CPC ..... H03L 7/00; H03L 7/06; H03L 7/08; H03L 7/0807; H03L 7/0816; H03L 7/089; H03L 7/0891; H03L 7/0895; H03L 7/099
USPC ........ 375/374, 375, 376; 327/147, 148, 154, 327/155, 156, 157
See application file for complete search history.

(56) References Cited

U.S. PATENT DOCUMENTS

| | | | | |
|---|---|---|---|---|
| 7,148,757 B2 * | 12/2006 | Chiu | ......................... | H03L 7/18 |
| | | | | 327/156 |
| 8,860,467 B2 | 10/2014 | Malipatil et al. | | |
| 10,880,129 B2 | 12/2020 | Eimitsu | | |
| 11,398,825 B1 * | 7/2022 | Eimitsu | ................. | H03L 7/0807 |
| 2020/0145182 A1 | 5/2020 | Kubo et al. | | |

FOREIGN PATENT DOCUMENTS

| | | |
|---|---|---|
| JP | 2014-183578 A | 9/2014 |
| JP | 2020-072453 A | 5/2020 |
| JP | 2020-155859 A | 9/2020 |

* cited by examiner

*Primary Examiner* — Hai L Nguyen
(74) *Attorney, Agent, or Firm* — Oblon, McClelland, Maier & Neustadt, L.L.P.

(57) ABSTRACT

A semiconductor device has a current controlled oscillation circuit configured to generate an oscillation clock in response to a current supplied, a first circuit configured to output a first signal when a phase of the oscillation clock is later than a phase of reception data, and to output a second signal when a phase of the oscillation clock is earlier than a phase of the reception data, and a current control circuit configured to control a current to be supplied to the current controlled oscillation circuit such that the number of times of output of the first signal from the first circuit matches the number of times of output of the second signal from the first circuit.

19 Claims, 9 Drawing Sheets

| Late (UP) | Early (DOWN) | FIRST VARIABLE CURRENT SOURCE | SECOND VARIABLE CURRENT SOURCE |
|---|---|---|---|
| 0 | 0 | OFF | ON |
| 1 | 0 | ON | ON |
| 0 | 1 | OFF | OFF |

SEMICONDUCTOR DEVICE, RECEPTION DEVICE, AND MEMORY CONTROLLER

CROSS REFERENCE TO RELATED APPLICATIONS

This application is based upon and claims the benefit of priority from the prior Japanese Patent Application No. 2021-152613, filed on Sep. 17, 2021, the entire contents of which are incorporated herein by reference.

FIELD

An embodiment of the present disclosure relates to a semiconductor device, a reception device, and a memory controller.

BACKGROUND

A reception circuit that receives high-speed serial data (hereinafter referred to as reception data) Includes a clock data recovery circuit (hereinafter, CDR circuit) that processes the reception data. The CDR circuit detects a delimiter (edge) of serial data that is reception data and extracts a clock signal and data. The CDR circuit includes a phase lock circuit. The phase lock circuit includes a current controlled oscillator that can vary the frequency of an oscillation clock in response to a supplied current.

The phase lock circuit controls a current supplied to the current controlled oscillator according to a phase shift between the oscillation clock generated by the current controlled oscillator and the reception data. However, when the communication speed of transfer of the reception data increases, the influence of variation in the current supplied to the current controlled oscillator increases. This variation may increase deterioration of the jitter tolerance characteristics due to a shift of the lock point of the phase lock circuit.

DETAILED DESCRIPTION

According to one embodiment, a semiconductor device has a current controlled oscillation circuit configured to generate an oscillation clock in response to a current supplied, a first circuit configured to output a first signal when a phase of the oscillation clock is later than a phase of reception data, and to output a second signal when a phase of the oscillation clock is earlier than a phase of the reception data, and a current control circuit configured to control a current to be supplied to the current controlled oscillation circuit such that the number of times of output of the first signal from the first circuit matches the number of times of output of the second signal from the first circuit.

An embodiment of a semiconductor device, a reception device, and a memory controller will be described below with reference to the drawings. Hereinafter, main components of the semiconductor device, the reception device, and the memory controller will be mainly described, but the semiconductor device, the reception device, and the memory controller may have components and functions that are not illustrated or described.

The following description does not exclude components or functions that are not illustrated or described.

Figure 1:
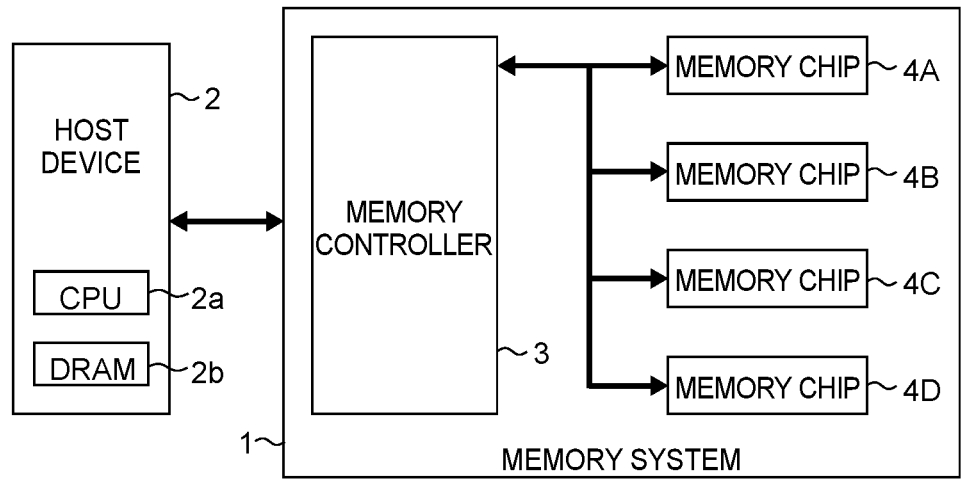
FIG. 1 is a block diagram illustrating a schematic configuration of a memory system including a memory controller according to an embodiment.

FIG. 1 is a block diagram illustrating a schematic configuration of a memory system 1 including a memory controller 3 according to an embodiment. The memory system 1 of FIG. 1 includes the memory controller 3 and a memory chip 4 (4A, 4B, 4C, and 4D). Although four memory chips 4A, 4B, 4C, and 4D are illustrated in FIG. 1, the number of the memory chips 4 is selected according to the specification of the memory system 1.

The memory system 1 is connectable to a host device 2. The host device 2 is, for example, an electronic device such as a personal computer, a mobile device, an in-vehicle device, and a server. The host device 2 includes a central processing unit (CPU) 2a as a processor, a ROM (not illustrated), and a dynamic random access memory (DRAM) 2b. In response to a request from the host device 2, the memory system 1 stores user data (hereinafter, simply referred to as data) from the host device 2 into each memory chip 4, reads data stored in each memory chip 4 to output the read data to the host device 2. Specifically, the memory system 1 can write data to each memory chip 4 in response to a write request from the host device 2 and read data from each memory chip 4 in response to a read request from the host device 2.

The memory system 1 may be a universal flash storage (UFS) device in which the memory controller 3 and the plurality of memory chips 4 are configured as one package, a solid state drive (SSD) of a BGA type, or the like. The memory system 1 may be a solid state drive (SSD) having a connector part connectable to the host device 2. FIG. 1 illustrates the memory system 1 as being connected to the host device 2.

The memory chip 4 is a semiconductor storage device including a NAND flash memory that stores data in a nonvolatile manner. As illustrated in FIG. 1, the memory controller 3 and each memory chip 4 are connected via a NAND bus. The memory controller 3 controls writing of data to the memory chip 4 in accordance with a write request from the host device 2. The memory controller 3 controls reading of data from the memory chip 4 in accordance with a read request from the host device 2. The memory controller 3 sometimes controls writing and reading of data to and from the memory chip 4 voluntarily, not by a request from the host device 2.

Figure 2:
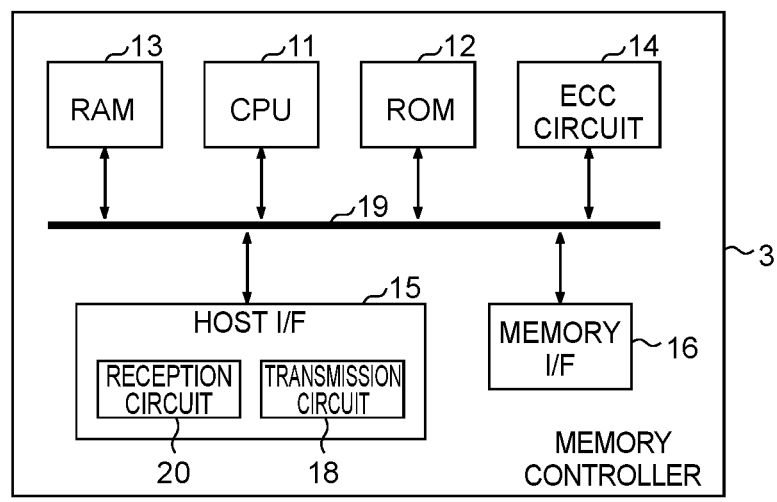
FIG. 2 is a block diagram illustrating an internal configuration of the memory controller.

FIG. 2 is a block diagram illustrating an internal configuration of the memory controller 3. In FIG. 2, the memory controller 3 includes a CPU 11, a ROM 12, a random access memory (RAM) 13, an error check and correct (ECC) circuit 14, a host interface (I/F) 15, and a memory interface (I/F) 16. The CPU 11, the ROM 12, the RAM 13, the ECC circuit 14, the host I/F 15, and the memory I/F 16 are connected to one another via an internal bus 19.

The host I/F 15 includes a reception circuit 20 and a transmission circuit 18. The reception circuit 20 includes the semiconductor device and the reception device according to the present embodiment. The reception circuit 20 receives data from the host device 2, and outputs, to the internal bus 19, a request, write data, and the like included in the reception data. The transmission circuit 18 transmits user data read from the memory chip 4, a response from the CPU 11, and the like to the host device 2. The host device 2 also includes an interface (I/F) including a reception circuit and a transmission circuit (not illustrated) corresponding to the reception circuit 20 and the transmission circuit 18 of the host I/F 15.

The host device 2 is connected with the reception circuit 20 and the transmission circuit 18 of the host I/F 15 via a predetermined interface. Examples of this interface include various interfaces such as a parallel interface of an embedded Multi Media Card (eMMC), a serial expansion interface of Peripheral Component Interconnect-Express (PCIe), and a high-speed serial interface of an M-PHY.

The memory I/F 16 controls processing of writing user data and the like into each memory chip 4 and processing of reading the user data and the like from each memory chip 4 based on an instruction from the CPU 11.

The CPU 11 integrally controls the memory controller 3. The CPU 11 may also be referred to as a micro processing unit (MPU). When receiving a request from the host device 2 via the host I/F 15, the CPU 11 performs control in accordance with the request. For example, in accordance with a request from the host device 2, the CPU 11 instructs the memory I/F 16 to write user data to each memory chip 4. In accordance with a request from the host device 2, the CPU 11 instructs the memory I/F 16 to read user data from each memory chip 4.

The CPU 11 determines a storage region (hereinafter, referred to as a memory region) of each memory chip 4 for the user data to be stored in the RAM 13. The user data is stored into the RAM 13 via the internal bus 19. The CPU 11 determines the memory region, for example, for data in units of pages that is a write unit, I.e., page data.

When receiving a write request from the host device 2, the CPU 11 determines the memory region of each memory chip 4 as a write destination. A physical address is assigned to the memory region of the memory chip 4. The CPU 11 manages the memory region of a data write destination using a physical address. The CPU 11 designates the physical address of the determined memory region and instructs the memory I/F 16 to write the user data into the memory chip 4. The CPU 11 receives, from the host device 2, a write request including a logical address managed by the host device 2. The CPU 11 manages correspondence between the logical address of user data and the physical address in which the user data is written. When receiving a read request including a logical address from the host device 2, the CPU 11 specifies the physical address corresponding to the logical address, designates the physical address, and instructs the memory I/F 16 to read the user data.

The ECC circuit 14 encodes the user data stored in the RAM 13 to generate a code word. The ECC circuit 14 decodes the code word read from each memory chip 4. The RAM 13 temporarily stores user data received from the host device 2 until the user data is stored into each memory chip 4 or temporarily stores data read from each memory chip 4 until the data is transmitted to the host device 2. The RAM 13 is, for example, a general-purpose memory such as a static random access memory (SRAM) and a dynamic random access memory (DRAM). The RAM 13 may be disposed outside the memory controller 3.

FIG. 2 illustrates a configuration example in which the memory controller 3 includes the ECC circuit 14 and the memory I/F 16. However, the ECC circuit 14 may be built in the memory I/F 16. The ECC circuit 14 may be built in each memory chip 4.

When receiving a write request from the host device 2, the memory controller 3 operates as follows. The CPU 11 temporarily stores the write data into the RAM 13. The CPU 11 reads the data stored in the RAM 13 and inputs the data to the ECC circuit 14. The ECC circuit 14 encodes the input data and provides a code word to the memory I/F 16. The memory I/F 16 writes, into each memory chip 4, the input code word.

When receiving a read request from the host device 2, the memory controller 3 operates as follows. The memory I/F 16 provides the code word read from each memory chip 4 to the ECC circuit 14. The ECC circuit 14 decodes the input code word and stores the decoded data into the RAM 13. The CPU 11 transmits the data stored in the RAM 13 to the host device 2 via the host I/F 15.

Figure 3:
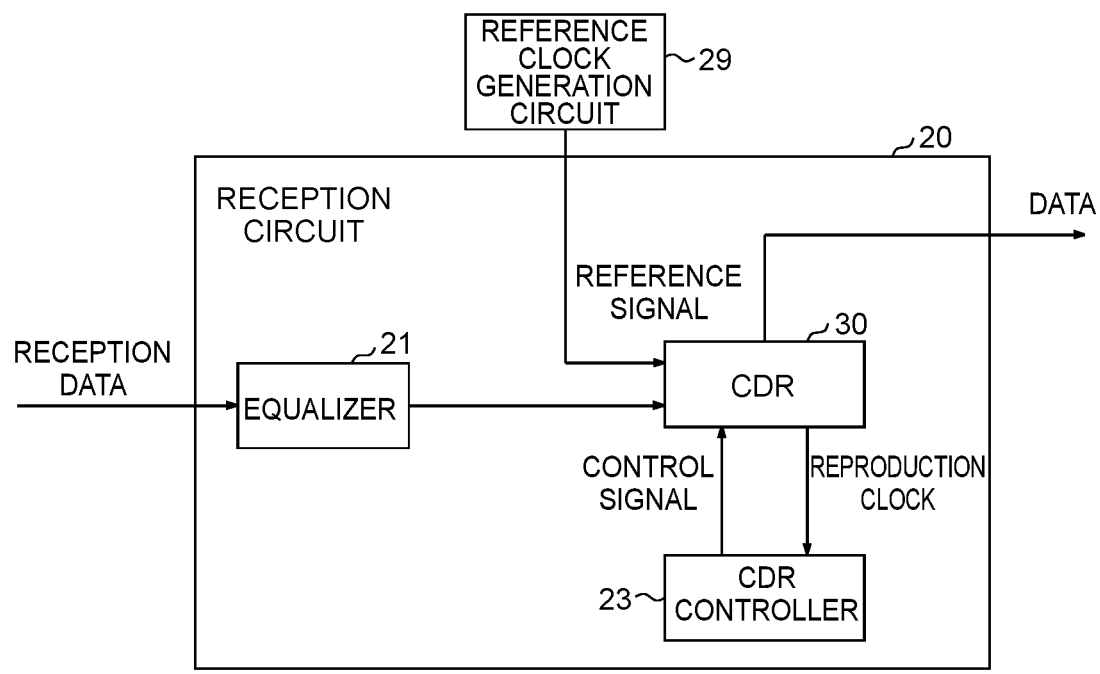
FIG. 3 is a block diagram illustrating an example of a specific configuration of a reception circuit of FIG. 2.

FIG. 3 is a block diagram illustrating an example of a specific configuration of the reception circuit 20 of FIG. 2. The reception circuit 20 receives, as reception data, data transmitted from the host device 2. The reception circuit 20 receives a reference signal from a reference clock generation circuit 29. The reception circuit 20 executes processing of extracting data included in the reception data and outputs the extracted data to a subsequent circuit. The reception circuit 20 includes an equalizer 21 and a CDR circuit 30. The equalizer 21 shapes the waveform of the reception data and outputs the data with the shaped waveform to the CDR circuit 30.

The CDR circuit 30 reproduces a clock for extracting data from the reception data based on the reception data. This clock is referred to as a reproduction clock. The CDR circuit 30 outputs a reproduction clock to a CDR circuit controller 23. Based on the reproduction clock, the CDR circuit controller 23 generates various control signals and the like for controlling the CDR circuit 30 and outputs the generated signals to the CDR circuit 30. The CDR circuit 30 receives a reference signal from the reference clock generation circuit 29. The reference signal is a clock signal of a certain frequency. The reference clock generation circuit 29 may be provided in the transmission circuit 18.

Figure 4:
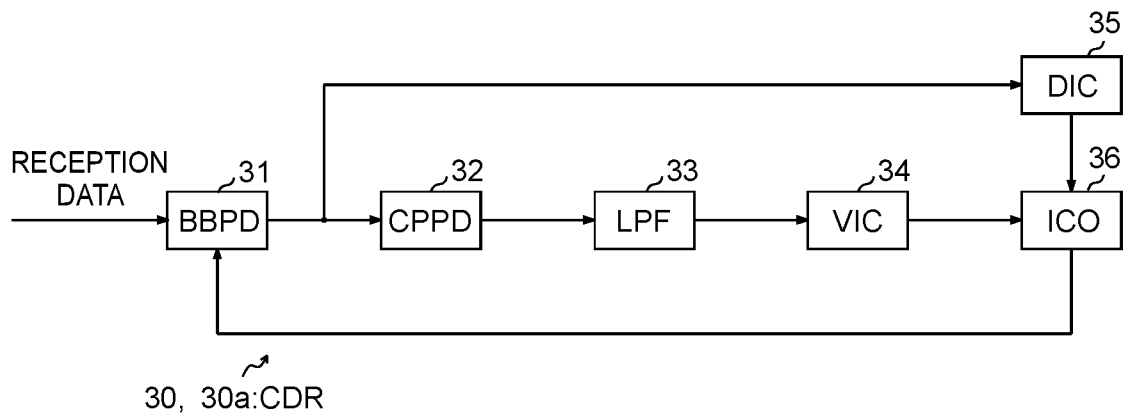
FIG. 4 is a block diagram illustrating an internal configuration of a CDR circuit of FIG. 3.

FIG. 4 is a block diagram illustrating an internal configuration of the CDR circuit 30 of FIG. 3. FIG. 4 illustrates a characteristic part of the internal configuration of the CDR circuit 30. The CDR circuit 30 of FIG. 3 may have components omitted in FIG. 4. The CDR circuit 30 of FIG. 4 includes a bang bang phase detector (BBPD, an example of a first circuit) 31, a charge pump for phase detector (CPPD, an example of a second circuit) 32, a loop filter (LPF, and example of a second integration circuit) 33, a voltage current converter (VIC, an example of a third circuit) 34, a digital current converter (DIC) 35, and a current control oscillator (ICO) 36.

The ICO 36 is a current controlled oscillation circuit that generates an oscillation clock in response to a current supplied. By controlling the current supplied to the ICO 36, it is possible to adjust the frequency and phase of the oscillation clock. The current supplied to the ICO 36 is controlled by a DIC 35 and a VIC 34. The ICO 36 outputs the generated oscillation clock to the BBPD 31.

The BBPD 31 is a circuit that outputs a phase detection signal indicating whether the phase of the oscillation clock of the ICO 36 is late or early with respect to the phase of the reception data. The phase detection signal output from the BBPD 31 includes a Late signal, which indicates that the phase is late, or an Early signal, which indicates that the phase is early. When the Late signal is output, control is performed to lead the phase of the oscillation clock of the ICO 36, and thus the Late signal is also referred to as an UP signal. When the Early signal is output, control is performed to lag the phase of the oscillation clock of the ICO 36, and thus the Early signal is also referred to as a DOWN signal. Hereinafter, output signals of the BBPD 31 are referred to as Late (UP) signal or Early (DOWN) signal.

The BBPD 31 sets the Late (UP) signal to a high level when determining that the phase of the oscillation clock of the ICO 36 is late with respect to the phase of the reception data, and sets the Early (DOWN) signal to a high level when determining that the phase of the oscillation clock of the ICO 36 is early with respect to the phase of the reception data. In the present description, that the BBPD 31 sets the Late (UP) signal to a high level is referred to as that the BBPD 31 outputs the Late (UP) signal, and that the BBPD 31 sets the Early (DOWN) signal to a high level is referred to as that the BBPD 31 outputs the Early (DOWN) signal.

The BBPD 31 repeatedly compares the phase of the reception data with the phase of the oscillation clock of the ICO 36, and outputs a Late (UP) signal or an Early (DOWN) signal indicated by a high-level pulse each time the BBPD 31 performs comparison. As described later, the BBPD 31 does not set both the Late (UP) signal and the Early (DOWN) signal to a high level, but sets either one to a high level or both to a low level.

The DIC 35 is a circuit that controls a current supplied to the ICO 36 based on the Late (UP) signal and the Early (DOWN) signal output from the BBPD 31. The larger the current supplied to the ICO 36 is, the earlier the phase of the oscillation clock of the ICO 36 becomes.

The DIC 35 controls a current of a variable current source described later provided in the DIC 35 based on the Late (UP) signal and the Early (DOWN) signal. This makes it possible to quickly switch the current supplied to the ICO 36 and to quickly control the phase of the oscillation clock of the ICO 36.

The CPPD 32 generates a current according to the Late (UP) signal and the Early (DOWN) signal output from the BBPD 31. The CPPD 32 generates a current in an orientation according to the Late (UP) signal and a current in an orientation according to the Early (DOWN) signal, and outputs a composite current of these currents.

The LPF 33 time-integrates the current output from the CPPD 32 and converts the current into a voltage. The VIC 34 converts the voltage output from the LPF 33 into a current and supplies the current to the ICO 36.

A signal path passing through the BBPD 31, the DIC 35, and the ICO 36 of FIG. 4 is referred to as a proportional path. As described above, in the proportional path, the current supplied from the DIC 35 to the ICO 36 is directly controlled based on the Late (UP) signal and the Early (DOWN) signal from the BBPD 31, and therefore the phase of the oscillation clock of the ICO 36 can be quickly controlled. Therefore, in the proportional path, the phase change amount (jitter) in a high-frequency region of the oscillation clock generated by the ICO 36 can be controlled.

A signal path passing through the BBPD 31, the CPPD 32, the LPF 33, the VIC 34, and the ICO 36 of FIG. 4 is referred to as an integration path. In the integration path, the current output from the CPPD 32 is time-integrated by the LPF 33, and therefore a high-frequency component is removed. Therefore, in the integration path, the phase change amount (jitter) in a low-frequency region of the oscillation clock generated by the ICO 36 can be controlled.

The phase change amount controlled with the integration path is sufficiently smaller than the phase change amount controlled with the proportional path. Therefore, when the phase change amount is controlled with the proportional path, the phase change amount controlled with the integration path can be ignored.

Figure 5:
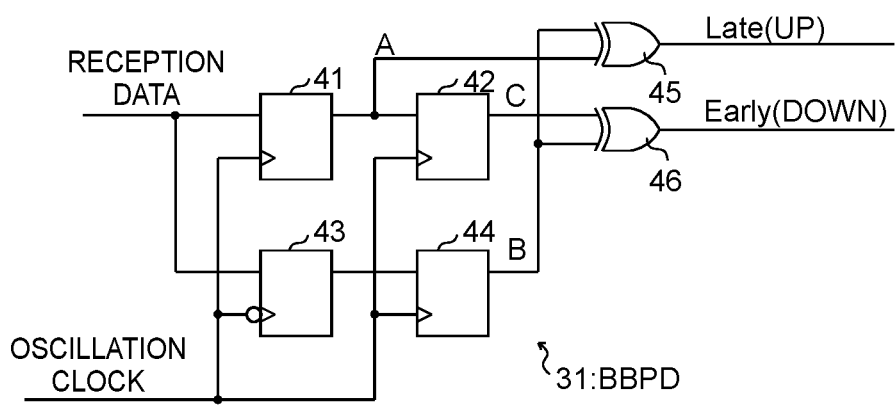
FIG. 5 is a circuit diagram illustrating an example of a specific configuration of a BBPD.

FIG. 5 is a circuit diagram illustrating an example of a specific configuration of the BBPD 31. The BBPD 31 of FIG. 5 includes four D flip-flops (hereinafter, first to fourth D-F/Fs) 41 to 44 and two ExOR gates (hereinafter, first and second ExORs) 45 and 46. The first D-F/F 41 and the second D-F/F 42 are connected in cascade, and the third D-F/F 43 and the fourth D-F/F 44 are connected in cascade. Received data is input to D terminals of the first D-F/F 41 and the third D-F/F 43. The oscillation clock generated by the ICO 36 is Input to clock terminals of the first, second, and fourth D-F/Fs 41, 42, and 44. An Inverted signal of the oscillation clock generated by the ICO 36 is Input to the clock terminal of the third D-F/F 43.

The first ExOR 45 outputs the Late (UP) signal that is an exclusive OR signal of an output signal A of the first D-F/F 41 and an output signal B of the fourth D-F/F 44. The second ExOR 46 outputs an Early (DOWN) signal that is an exclusive OR signal of an output signal C of the second D-F/F 42 and an output signal B of the fourth D-F/F 44.

Figure 6:
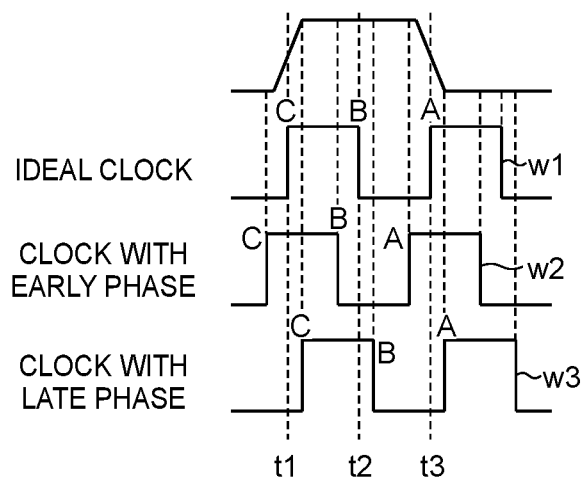
FIG. 6 is a timing diagram illustrating an operation of the BBPD of FIG. 5.

FIG. 6 is a timing diagram illustrating the operation of the BBPD 31 of FIG. 5. The oscillation clock of the ICO 36 is ideally a signal (hereinafter, referred to as an ideal clock) having an edge at a midpoint and a change point (i.e., an edge) of a data section of the reception data as indicated by a waveform w1. In FIG. 6, edge positions of the ideal clock are A, B, and C. FIG. 6 illustrates an example in which time t1 and time t3 indicate the change point of the reception data, time t2 indicates the midpoint of the data section of the reception data, and the reception data maintaining a high level within the period of the time t1 to the time t3 is sampled.

The reception data sampled at the edge position A is output from the first D-F/F 41, the reception data sampled at the edge position B is output from the fourth D-F/F 44, and the reception data sampled at the edge position C is output from the second D-F/F 42.

As illustrated in FIG. 6, when the reception data maintaining a high level during the times t1 to t3 is sampled with the ideal clock, the BBPD 31 sets the sampling data at the edge positions A, B, and C to a high level. Therefore, the output signal of the first ExOR 45 becomes at a low level, the output signal of the second ExOR 46 becomes at a low level, and both the Late (UP) signal and the Early (DOWN) signal become at a low level.

On the other hand, when the phase of the oscillation clock of the ICO 36 is earlier than the ideal clock, the timing of the edge positions A, B, and C becomes earlier than the ideal clock as in a waveform w2. Therefore, the reception data of the first D-F/F 41 sampled at the edge position A becomes at a high level (=1), the reception data of the fourth D-F/F 44 sampled at the edge position B becomes at a high level (=1), and the reception data of the second D-F/F 42 sampled at the edge position C becomes at a low level (=0).

In this case, the output signal of the first ExOR 45 becomes at a low level, the output signal of the second ExOR 46 becomes at a high level, and a high-level Early (DOWN) signal is output from the second ExOR 46.

When the phase of the oscillation clock of the ICO 36 is later than the ideal clock, the timing of the edge positions A, B, and C becomes later than the ideal clock as in a waveform w3. Therefore, the reception data of the first D-F/F 41 sampled at the edge position A becomes at a low level (=0), the reception data of the fourth D-F/F 44 sampled at the edge position B becomes at a high level (=1), and the reception data of the second D-F/F 42 sampled at the edge position C becomes at a high level (=1).

In this case, the output signal of the first ExOR 45 becomes at a high level, the output signal of the second ExOR 46 becomes at a low level, and a high-level Late (UP) signal is output from the first ExOR 45.

Thus, the BBPD 31 outputs the high-level Early (DOWN) signal when the phase of the oscillation clock generated by the ICO 36 is earlier than the ideal clock, and outputs the high-level Late (UP) signal when the phase of the oscillation clock generated by the ICO 36 is later than the ideal clock.

Figure 7:
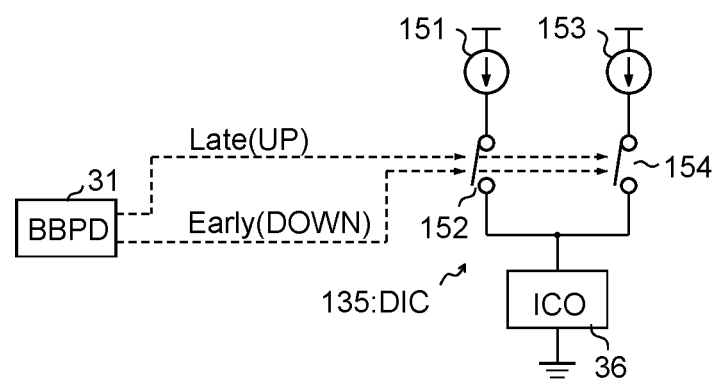
FIG. 7 is a circuit diagram illustrating a basic configuration of a DIC according to a comparative example.

FIG. 7 is a circuit diagram illustrating a basic configuration of a DIC 135 according to a comparative example. The DIC 135 according to the comparative example is different in configuration from the DIC 35 according to the present embodiment. Basic functions and problems of the DIC 135 according to the comparative example will be described with reference to FIG. 7.

The DIC 135 includes a first current source 151, a first switching circuit 152, a second current source 153, and a second switching circuit 154. The first current source 151 and the first switching circuit 152 are connected in series between a power supply voltage node and an input node of the ICO 36. The second current source 153 and the second switching circuit 154 are connected in series between the power supply voltage node and the input node of the ICO 36. The first current source 151 and the second current source 153 apply the same fixed current.

The first switching circuit 152 is turned on or off by logic of the Late (UP) signal. The second switching circuit 154 is turned on or off by logic of the Early (DOWN) signal. The first switching circuit 152 and the second switching circuit 154 include transistors, for example.

For example, when the Late (UP) signal is at a high level and the Early (DOWN) signal is at a low level, both the first switching circuit 152 and the second switching circuit 154 are turned on, and both the current from the first current source 151 and the current from the second current source 153 are supplied to the ICO 36. In this case, the phase of the oscillation clock of the ICO 36 becomes early.

When the Late (UP) signal is at a low level and the Early (DOWN) signal is at a high level, both the first switching circuit 152 and the second switching circuit 154 are turned off. Due to this, neither the current from the first current source 151 nor the current from the second current source 153 is supplied to the ICO 36, and the phase of the oscillation clock of the ICO 36 becomes late.

When both the Late (UP) signal and the Early (DOWN) signal are at the low level, the first switching circuit 152 is turned off, and the second switching circuit 154 is turned on. Due to this, the current from the first current source 151 is not supplied to the ICO 36, but the current from the second current source 153 is supplied to the ICO 36. Due to this, the phase of the oscillation clock of the ICO 36 hardly changes.

In this manner, the amount of current flowing from the first current source 151 and the second current source 153 to the ICO 36 can be controlled by controlling on or off of the first switching circuit 152 and the second switching circuit 154 by the logic of the Late (UP) signal and the Early (DOWN) signal. This makes it possible to control the phase of the oscillation signal generated by the ICO 36.

However, in the case of the configuration of the DIC 135 according to the comparative example, there is a possibility that the phase change amounts of the oscillation clock of the ICO 36 do not necessarily match on the UP side and the DOWN side. Therefore, there is a possibility that the number of times of outputting the pulse of the Late (UP) signal from the first ExOR 45 does not match the number of times of outputting the pulse of the Early (DOWN) signal from the second ExOR 46. Note that the UP side refers to performing control to make the phase early, and the DOWN side refers to performing control to make the phase late.

Figure 8:
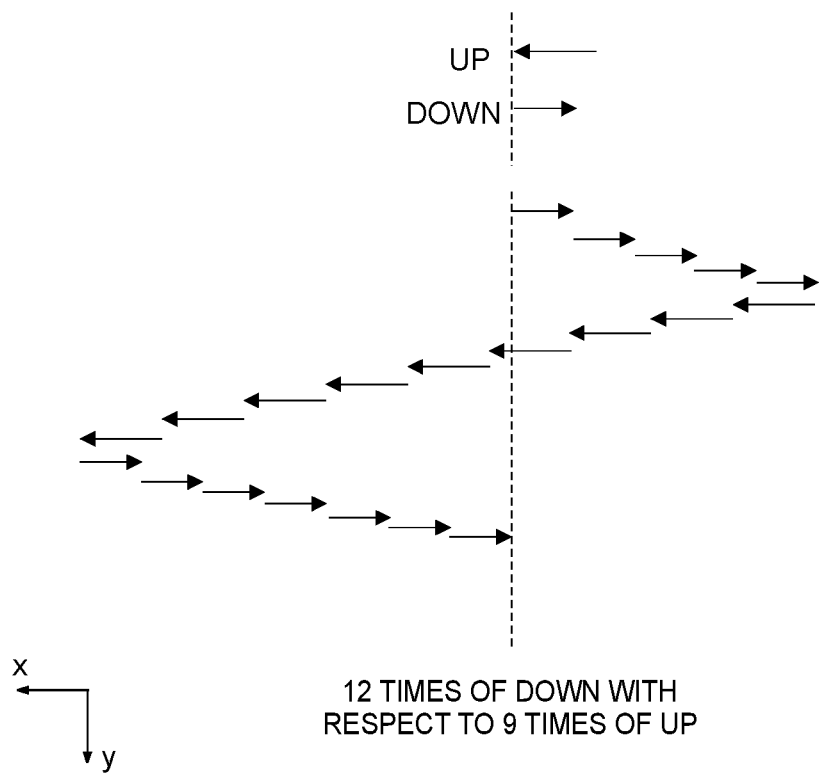
FIG. 8 is a diagram illustrating transition of a phase change amount of an oscillation clock of an ICO according to the comparative example.

FIG. 8 is a diagram illustrating transition of the phase change amount of an oscillation clock of the ICO 36 according to the comparative example. In FIG. 8, the phase change amount when the first ExOR 45 of the BBPD 31 outputs a Late (UP) signal indicated by a high-level pulse is indicated by a leftward arrow, and the phase change amount when the second ExOR 46 outputs an Early (DOWN) signal indicated by a high-level pulse is indicated by a rightward arrow. One arrow corresponds to one logic change of Late (UP) or Early (DOWN).

FIG. 8 illustrates an example in which a pulse of the Late (UP) signal is output 9 times from the first ExOR 45 and a pulse of the Early (DOWN) signal is output 12 times from the second ExOR 46 to adjust the phase of the oscillation clock of the ICO 36. In FIG. 8, a horizontal direction x indicates a phase change direction, and a vertical direction y indicates a time axis direction. The broken line in FIG. 8 indicates the phase zero. The left half form the center in the horizontal direction x of FIG. 8 indicates that the phase is early, and the right half indicates that the phase is late. The lower side in the vertical direction of FIG. 8 indicates a time elapse direction.

In the example of FIG. 8, since there is a difference in phase change amount between the UP side and the DOWN side, the number of pulses of the Early (DOWN) signal is larger than that of the Late (UP) signal. The smaller the phase change amount per one time is, the larger the number of pulses becomes.

Thus, if there is a difference in phase change amount between the UP side and the DOWN side, when the BBPD 31 samples the reception data with the oscillation clock generated by the ICO 36, there is a difference in margin between the setup time and the hold time, and the jitter tolerance is deteriorated.

Figure 9:
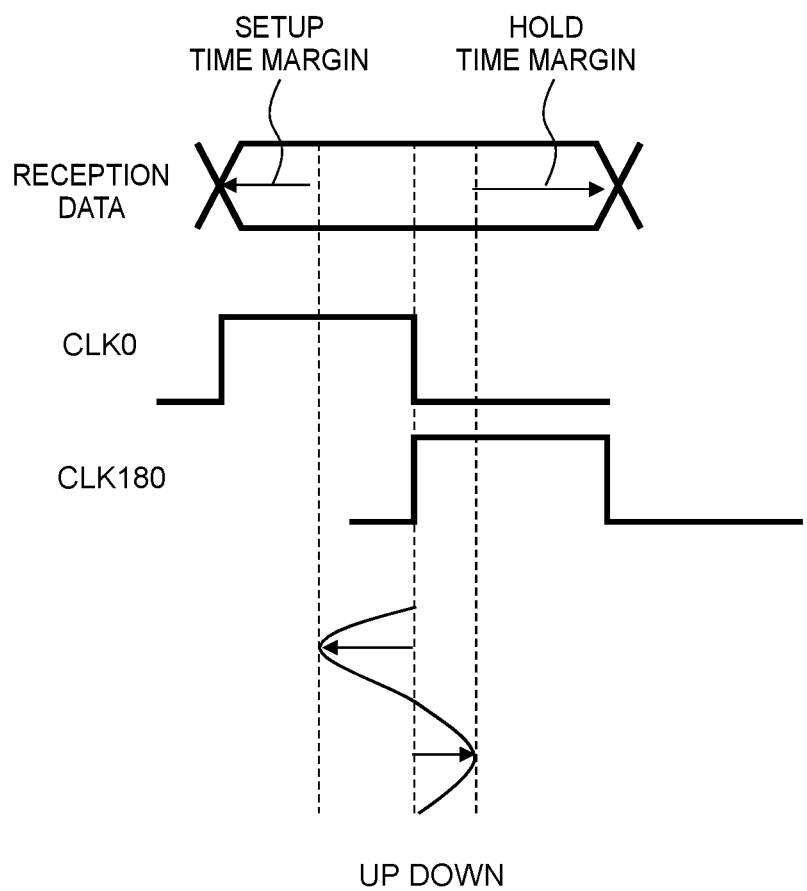
FIG. 9 is a diagram illustrating setup time and hold time when there is a difference in phase change amount between an UP side and a DOWN side.

FIG. 9 is a diagram illustrating the setup time and the hold time when there is a difference in phase change amount between the UP side and the DOWN side. FIG. 9 illustrates an example in which data is sampled by a clock CLK 180 whose phase is shifted by 180 degrees from a clock CLK0 having an edge at the change point of the reception data and at the midpoint of the data section. In this case, if there is a difference in phase change amount between the UP side and the DOWN side, a difference occurs in the margin of the setup time and the hold time, as illustrated in FIG. 9, and the jitter tolerance is deteriorated.

Therefore, in a case where the number of times of outputting the pulse of the Late (UP) signal from the first ExOR 45 is larger than the number of times of outputting the pulse of the Early (DOWN) signal from the second ExOR 46, the CDR circuit 30 according to the present embodiment determines that the phase change amount on the UP side is small. In response, in the DIC 35, the CDR circuit 30 makes the current output from one current source larger and/or makes the current output from the other current source smaller. Conversely, in a case where the number of times of outputting the pulse of the Early (DOWN) signal from the second ExOR 46 is larger than the number of times of outputting the pulse of the Late (UP) signal from the first ExOR 45, the CDR circuit 30 determines that the phase change amount on the DOWN side is small. In response, in the DIC 35, the CDR circuit 30 makes the current output from one current source smaller and/or makes the current output from the other current source larger. This makes it possible to be the same (equalize) the number of times of outputting the pulse of the Late (UP) signal from the first ExOR 45 and the number of times of outputting the pulse of the Early (DOWN) signal from the second ExOR 46, and improve the jitter tolerance.

Figures 10, 11:
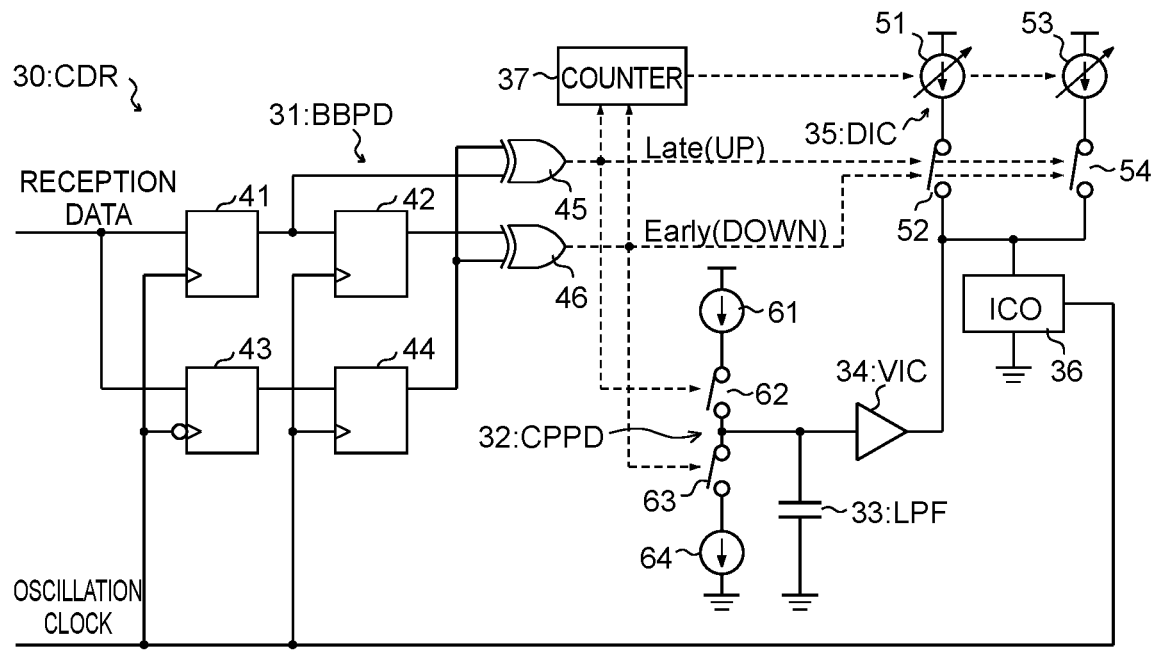
FIG. 10 is a circuit diagram illustrating a main part of a CDR circuit according to an embodiment.
FIG. 11 is a diagram illustrating a condition under which a first switching circuit and a second switching circuit in the DIC of FIG. 10 are turned on or off.

FIG. 10 is a circuit diagram illustrating a main part of the CDR circuit 30 according to an embodiment. The CDR circuit 30 of FIG. 10 includes the BBPD 31, the CPPD 32, the LPF 33, the VIC 34, the DIC 35, the ICO 36, and a counter 37.

As described with reference to FIG. 5, the BBPD 31 includes the first to fourth D-F/Fs 41 to 44 and the first and second ExORs 45 and 46. Reception data is input to the D terminal of the first D-F/F 41. An oscillation clock generated by the ICO 36 is input to the clock terminals of the first to fourth D-F/Fs 41 to 44. The first, second, and fourth D-F/Fs 41, 42, and 44 hold the data input to the D terminal at a rising edge of the oscillation clock. On the other hand, the third D-F/F 43 holds the reception data input to the D terminal at a falling edge of the oscillation clock.

The CPPD 32 includes a third current source 61, a third switching circuit 62, a fourth switching circuit 63, and a fourth current source 64. The third current source 61, the third switching circuit 62, the fourth switching circuit 63, and the fourth current source 64 are connected in series between the power supply voltage node and a ground node. The third switching circuit 62 is turned on while the pulse of a Late (UP) signal is output, and is turned off otherwise. The fourth switching circuit 63 is turned on while the pulse of an Early (DOWN) signal is output, and is turned off otherwise. The third switching circuit 62 and the fourth current source 64 include transistors, for example.

The LPF 33 has a capacitor. When the third switching circuit 62 is turned on, the current from the third current source 61 passes through the third switching circuit 62 and charges the capacitor included in the LPF 33. On the other hand, when the fourth switching circuit 63 is turned on, a current flows from the capacitor through the fourth switching circuit 63 and the fourth current source 64. Thus, the capacitor included in the LPF 33 performs charging and discharging according to the number of times of outputting the pulse of the Late (UP) signal and the number of times of outputting the pulse of the Early (DOWN) signal. The LPF 33 outputs a voltage corresponding to a difference between the number of times of outputting the pulse of the Late (UP) signal and the number of times of outputting the pulse of the Early (DOWN) signal. The VIC 34 converts the voltage output from the LPF 33 into a current and supplies the current to the ICO 36.

The DIC 35 includes a first variable current source 51 (first current source), a first switching circuit 52, a second variable current source 53 (second current source), and a second switching circuit 54. The first variable current source 51 and the first switching circuit 52 are connected in series between the power supply voltage node and the input node of the ICO 36. The second variable current source 53 and the second switching circuit 54 are connected in series between the power supply voltage node and the input node of the ICO 36. The first variable current source 51 and the second variable current source 53 apply a controllable variable current. The first switching circuit 52 is turned on or off by logic of the Late (UP) signal. The second switching circuit 54 is turned on or off by logic of the Early (DOWN) signal. The first switching circuit 52 and the second switching circuit 54 include transistors, for example.

Thus, the DIC 35 of FIG. 10 has a configuration in which the first current source 151 and the second current source 153 in the DIC 135 of FIG. 7 are replaced with the first variable current source 51 and the second variable current source 53.

The currents output from the first variable current source 51 and the second variable current source 53 are controlled according to the count value of the counter 37. The counter 37 is a circuit that counts the number of pulses of the Late (UP) signal and counts the number of pulses of the Early (DOWN) signal. The counter 37 outputs a control signal indicating which of the number of pulses of the Late (UP) signal and the number of pulses of the Early (DOWN) signal has a larger number of pulses having been output. The control signal may include only information indicating which of the number of pulses of the Late (UP) signal and the number of pulses of the Early (DOWN) signal is larger, or may include, in addition to this information, information indicating it is larger by how many pulses.

The control signal output from the counter 37 is used to control the current output from the first variable current source 51 and the current output from the second variable current source 53. For example, in a case where the control signal includes information indicating that the number of pulses of the Late (UP) signal is larger than the number of pulses of the Early (DOWN) signal, the current output from the first variable current source 51 is made larger and/or the current output from the second variable current source 53 is made smaller. Conversely, in a case where the control signal output from the counter 37 includes information indicating that the number of pulses of the Early (DOWN) signal is larger than the number of pulses of the Late (UP) signal, the current output from the second variable current source 53 is made larger and/or the current output from the first variable current source 51 is made smaller.

In a case where the control signal includes information indicating it is larger by how many pulses, the difference between the current output from the first variable current source 51 and the current output from the second variable current source 53 may be increased or decreased according to the larger number of pulses. Due to this, when there is a large gap between the number of pulses of the Late (UP) signal and the number of pulses of the Early (DOWN) signal, the gap in the number of pulses can be quickly resolved.

The counter 37 repeatedly counts the number of times of the Late (UP) signal and the number of times of the Early (DOWN) signal during the period obtained by multiplying the update cycle (may also referred to as internal latency) of the oscillation clock of the CDR circuit 30 by the number of repetitions for eliminating errors due to a phase difference, noise, and the like. As described above, the CDR circuit 30 according to the embodiment may control the currents output from the first variable current source 51 and the second variable current source 53 according to the count number of the counter 37, or may compare the count number of the counter 37 with a threshold and change the currents output from the first variable current source 51 and the second variable current source 53 when the count number exceeds the threshold.

After the period until the currents output from the first variable current source 51 and the second variable current source 53 are changed and stabilized has elapsed, the counter 37 starts a new count. The count value of the counter 37 is reset in a standby period until the currents output from the first variable current source 51 and the second variable current source 53 are changed and the changed current is stabilized. The counter 37 cancels the reset before starting a new count.

FIG. 11 is a diagram illustrating a condition under which the first switching circuit 52 and the second switching circuit 54 of the DIC 35 illustrated in FIG. 10 are turned on or off. As illustrated in FIG. 11, the first switching circuit 52 and the second switching circuit 54 are turned on or off by logic of the Late (UP) signal and the Early (DOWN) signal. The first to fourth D-F/Fs 41 to 44 of the BBPD 31 illustrated in FIG. 10 are designed such that neither the Late (UP) signal nor the Early (DOWN) signal outputs a high-level pulse at the same time. Therefore, in FIG. 11, there is no condition under which both the Late (UP) signal and the Early (DOWN) signal become at a high level (=1).

As illustrated in FIG. 11, when both the Late (UP) signal and the Early (DOWN) signal are at a low level (=0), the first switching circuit 52 connected in series to the first variable current source 51 is turned off, and the second switching circuit 54 connected in series to the second variable current source 53 is turned on. When the Late (UP) signal is at a high level (=1) and the Early (DOWN) signal is at a low level (=0), both the first switching circuit 52 and the second switching circuit 54 are turned on. When the Late (UP) signal is at a low level (=0) and the Early (DOWN) signal is at a high level (=1), both the first switching circuit 52 and the second switching circuit 54 are turned off.

Due to this, when a high-level pulse of the Late (UP) signal is output from the BBPD 31, the currents from both the first variable current source 51 and the second variable current source 53 are supplied to the ICO 36, and the phase of the oscillation clock of the ICO 36 becomes earlier. On the other hand, when a high-level pulse of the Early (DOWN) signal is output from the BBPD 31, the currents from both the first variable current source 51 and the second variable current source 53 are not supplied to the ICO 36, and thus the phase of the oscillation clock of the ICO 36 becomes late.

In the CDR circuit 30 of FIG. 10, when the number of pulses of the Late (UP) signal counted by the counter 37 is larger than the number of pulses of the Early (DOWN) signal, the current output from the first variable current source 51 is made larger than the current output from the second variable current source 53. Due to this, when the Late (UP) signal is output, the current flowing from the DIC 35 to the ICO 36 increases more. At this time, the current supplied from the VIC 33 to the ICO 36 in the integration path relatively decreases. However, since the increment of the current flowing from the DIC 35 to the ICO 36 is larger, it can be expected that the phase of the oscillation clock of the ICO 36 quickly increases.

On the other hand, when the number of pulses of the Early (DOWN) signal is larger than the number of pulses of the Late (UP) signal, the current output from the second variable current source 53 is made larger than the current output from the first variable current source 51. Due to this, when neither the Late (UP) signal nor the Early (DOWN) signal is output, as illustrated in the upper part of FIG. 11, the first switching circuit 52 is turned off and the second switching circuit 54 is turned on, and the current from the second variable current source 53 is supplied to the ICO 36. In this state, the phases substantially match. In this state, the current supplied from the second variable current source 53 to the ICO 36 is increased. At this time, the current from the VIC 34 to the ICO 36 in the integration path relatively decreases. When the Early (DOWN) signal is output, as illustrated in the lower part of FIG. 11, both the first switching circuit 52 and the second switching circuit 54 are turned off, and no current flows from the DIC 35 to the ICO 36. At this time, a current flows from the VIC 33 to the ICO 36 in the integration path. The current from the VIC 33 in the integration path is reduced as described above. Since the response of the integration path is relatively slow, the current from the VIC 33 does not rapidly increase, and as a result, it can be expected that the phase of the oscillation clock of the ICO 36 becomes quickly late.

By such control, the number of pulses of the Late (UP) signal and the number of pulses of the Early (DOWN) signal output from the BBPD 31 are controlled to be the same or equal. When the number of pulses of the Late (UP) signal and the number of pulses of the Early (DOWN) signal become the same or equal, the phase change amount of the oscillation signal generated by the ICO 36 does not fluctuate between the UP side and the DOWN side, an imbalance between the setup time and the hold time when the reception data is sampled with the oscillation clock is eliminated, and jitter tolerance can be improved.

Figure 12:
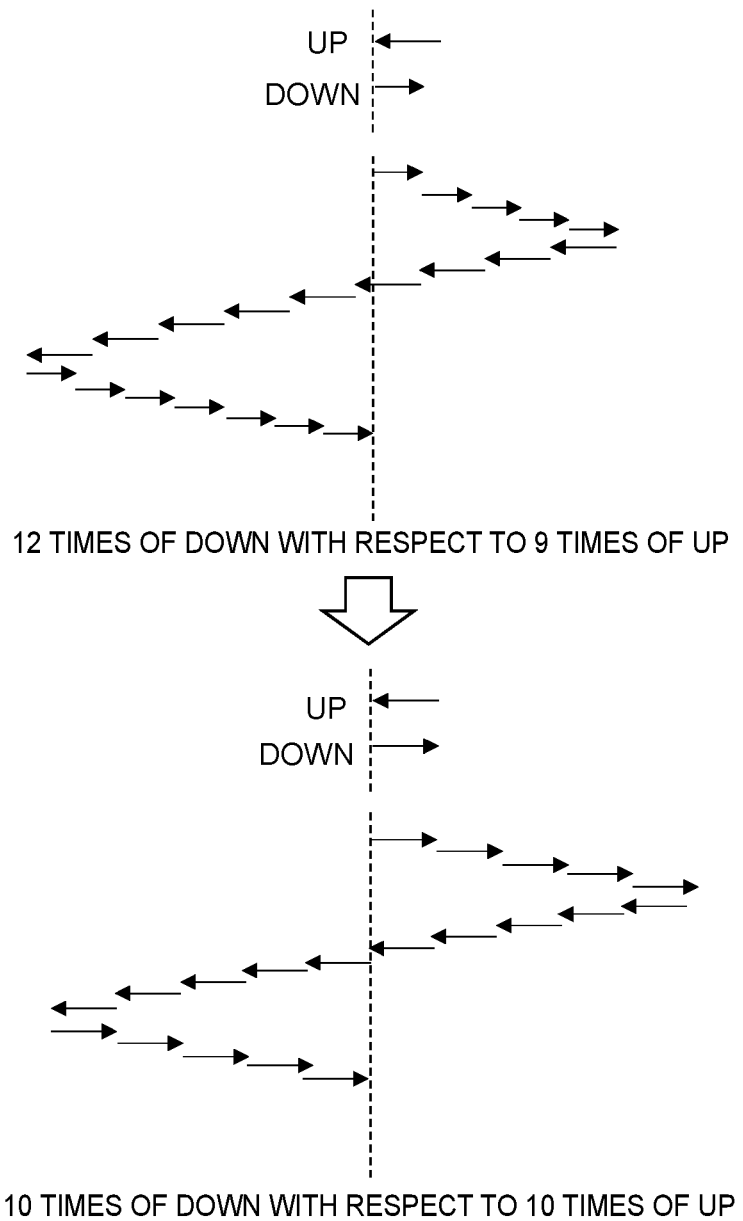
FIG. 12 is a diagram illustrating transition of a phase change amount of an oscillation clock of an ICO.

FIG. 12 is a diagram illustrating transition of the phase change amount of the oscillation clock of the ICO 36. The upper side of FIG. 12 illustrates transition of the phase change amount by the CDR circuit 30 of FIG. 7, which is the same as the transition illustrated in FIG. 8. On the other hand, the lower side illustrates transition of the phase change amount by the CDR circuit 30 according to the embodiment of FIG. 10. In the CDR circuit 30 using the DIC 35 of FIG. 10, the phase change amount does not fluctuate between the UP side and the DOWN side. Therefore, in the CDR circuit 30 using the DIC 35 of FIG. 7, 9 pulses are required on the UP side and 12 pulses are required on the DOWN side, whereas in the CDR circuit 30 using the DIC 35 of FIG. 10, 10 pulses are required on the UP side and 10 pulses are required on the DOWN side. Thus, according to the CDR circuit 30 according to the present embodiment, since the number of times of phase adjustment is equal between the UP side and the DOWN side, the phase change amount does not fluctuate, and the jitter tolerance can be improved.

In the CDR circuit 30 illustrated in FIG. 10, the counter 37 counts the number of pulses of the Late (UP) signal and the number of pulses of the Early (DOWN) signal, and the currents output from the first variable current source 51 and the second variable current source 53 are controlled according to the magnitude of the count numbers of the both. However, similar control can be performed using a configuration other than the counter 37.

Figure 13:
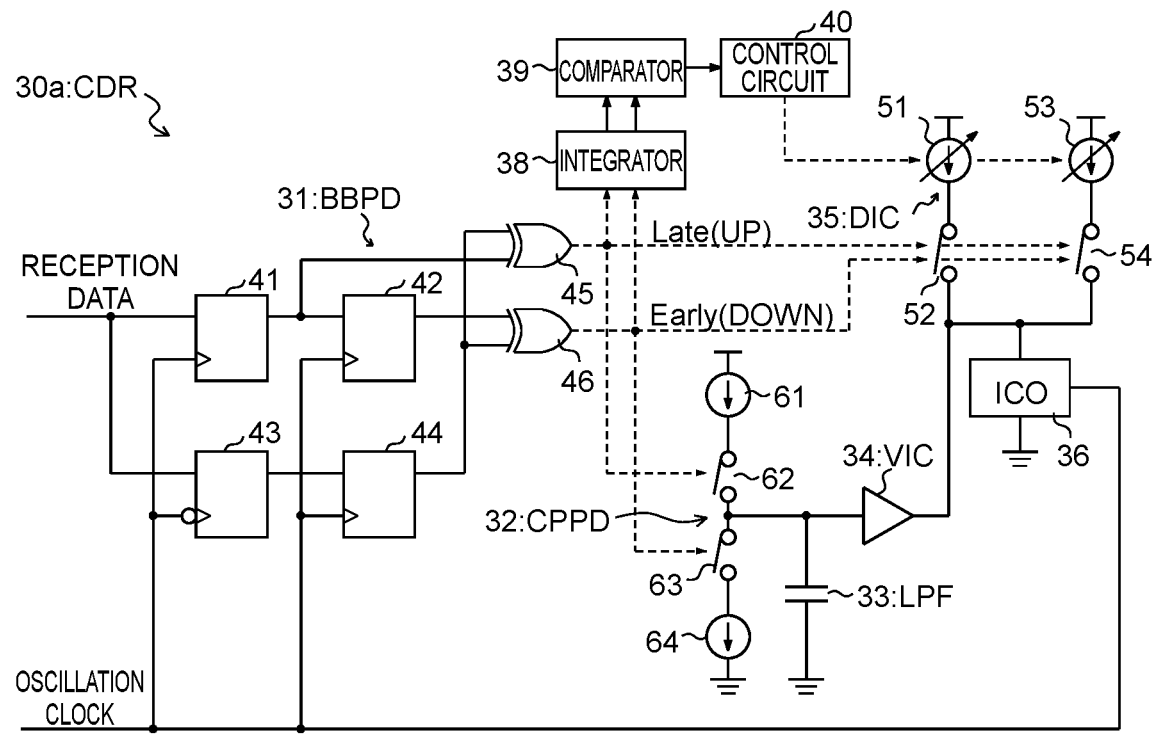
FIG. 13 is a circuit diagram illustrating a main part of a CDR circuit according to a modification of the embodiment.

FIG. 13 is a circuit diagram illustrating a main part of a CDR circuit 30a according to a modification of the embodiment. The CDR circuit 30a of FIG. 13 includes circuits of an integrator (first integration circuit) 38, a comparator (comparison circuit) 39, and a control circuit 40, in place of the counter 37 of FIG. 10.

The integrator 38 time-integrates the pulse of the Late (UP) signal output from the BBPD 31 and time-integrates the pulse of the Early (DOWN) signal output from the BBPD 31. The integrator 38 outputs a voltage signal (first voltage signal) obtained by time-integrating the pulse of the Late (UP) signal and a voltage signal (second voltage signal) obtained by time-integrating the pulse of the Early (DOWN) signal.

The comparator 39 compares the first voltage signal and the second voltage signal output from the integrator 38, and detects which of the number of pulses of the Late (UP) signal and the number of pulses of the Early (DOWN) signal is larger.

Based on the comparison result of the comparator 39, the control circuit 40 controls currents output from the first variable current source 51 and the second variable current source 53. Specifically, when the number of pulses of the Late (UP) signal is larger than the number of pulses of the Early (DOWN) signal, the current output from the first variable current source 51 is made larger, and the current output from the second variable current source 53 is made smaller. Conversely, when the number of pulses of the Early (DOWN) signal is larger than the number of pulses of the Late (UP) signal, the current output from the second variable current source 53 is made larger, and the current output from the first variable current source 51 is made smaller.

Thus, in the present embodiment, in a case where the current supplied to the ICO 36 is controlled by the Late (UP) signal and the Early (DOWN) signal output from the BBPD 31 to control the phase of the oscillation clock of the ICO 36, the currents that are output from the first variable current source 51 and the second variable current source 53 and that are generate the current supplied to the ICO 36, are controlled such that the number of pulses of the Late (UP) signal and the number of pulses of the Early (DOWN) signal output from the BBPD 31 become the same. This makes it possible to equalize the margins of the setup time and the hold time when the reception data is sampled with the oscillation clock, and improve the jitter tolerance.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A semiconductor device comprising:
a current controlled oscillation circuit configured to generate an oscillation clock in response to a current supplied;
a first circuit configured to output a first signal when a phase of the oscillation clock is later than a phase of reception data, and to output a second signal when a phase of the oscillation clock is earlier than a phase of the reception data; and
a current control circuit configured to control switching on whether a current is supplied to the current controlled oscillation circuit based on a number of times of output of the first signal and a number of times of output of the second signal such that the number of times of output of the first signal from the first circuit matches the number of times of output of the second signal from the first circuit.

2. The semiconductor device according to claim 1, wherein
the current control circuit comprises:
a first current source configured to control a current to be supplied to the current controlled oscillation circuit based on the number of times of output of the first signal and the number of times of output of the second signal,
a second current source configured to control a current to be supplied to the current controlled oscillation circuit based on the number of times of output of the first signal and the number of times of output of the second signal,
a first switching circuit configured to switch whether or not to supply the current from the first current source to the current controlled oscillation circuit based on the first signal, and
a second switching circuit configured to switch whether or not to supply the current from the second current source to the current controlled oscillation circuit based on the second signal.

3. The semiconductor device according to claim 2, wherein
the first current source is configured to output a current larger than the current being output when the number of times of output of the first signal is larger than the number of times of output of the second signal, and to output a current smaller than the current being output when the number of times of output of the first signal is smaller than the number of times of output of the second signal, such that the number of times of output of the first signal from the first circuit matches the number of times of output of the second signal from the first circuit.

4. The semiconductor device according to claim 2, wherein
the first current source is configured to control the current to be supplied to the current controlled oscillation circuit based on the first signal and the second signal such that the number of times of output of the first signal is equal to the number of times of output of the second signal, and
the second current source is configured to control the current to be supplied to the current controlled oscillation circuit based on the first signal and the second signal such that the number of times of output of the first signal from the first circuit is equal to the number of times of output of the second signal from the first circuit.

5. The semiconductor device according to claim 2 further comprising
a counter configured to count the number of times of output of the first signal from the first circuit and the number of times of output of the second signal, wherein
the first current source and the second current source are configured to control the current to be supplied to the current controlled oscillation circuit such that the number of times of output of the first signal counted by the counter is equal to the number of times of output of the second signal counted by the counter.

6. The semiconductor device according to claim 5, wherein
in response to the first current source or the second current source controlling the current, the counter is configured to reset a count of the number of times of output of the first signal and the number of times of output of the second signal, and to recount after the controlling of the current is completed.

7. The semiconductor device according to claim 2, wherein
the first switching circuit is configured to supply the current from the first current source to the current controlled oscillation circuit while the first signal is output from the first circuit, and to prevent the current from the first current source from being supplied to the current controlled oscillation circuit while the second signal is output from the first circuit.

8. The semiconductor device according to claim 2, wherein
the second switching circuit is configured to supply the current from the second current source to the current controlled oscillation circuit while the second signal is output from the first circuit, and to prevent the current from the second current source from being supplied to the current controlled oscillation circuit while the first signal is output from the first circuit.

9. The semiconductor device according to claim 1, wherein
the current control circuit is configured to control a phase of the oscillation clock by controlling the current to be supplied to the current controlled oscillation circuit.

10. The semiconductor device according to claim 1 further comprising:
a second circuit configured to output a current according to the number of times of output of the first signal and the number of times of output of the second signal;
a second integration circuit configured to time-integrate the current output from the second circuit; and
a third circuit configured to control a current flowing through the current controlled oscillation circuit based on an output signal of the second integration circuit.

11. The semiconductor device according to claim 10, wherein
the third circuit is configured to control a phase change amount of the oscillation clock in a frequency band lower than a frequency band of the current control circuit.

12. The semiconductor device according to claim 1, wherein
the first signal is a signal instructing to make a phase of the oscillation clock early, and
the second signal is a signal instructing to make a phase of the oscillation clock late.

13. A reception device comprising:
an equalizer circuit configured to shape a waveform of input data; and
a clock data reproduction circuit including a semiconductor device configured to input, as reception data, the input data having a waveform shaped by the equalizer circuit, the clock data reproduction circuit reproducing a clock and data from the reception data, wherein
the semiconductor circuit comprises:
a current controlled oscillation circuit configured to generate an oscillation clock in response to a current supplied,
a first circuit configured to output a first signal when a phase of the oscillation clock is later than a phase of reception data, and to output a second signal when a phase of the oscillation clock is earlier than a phase of the reception data, and
a current control circuit configured to control switching on whether a current is supplied to the current controlled oscillation circuit based on a number of times of output of the first signal and a number of times of output of the second signal such that the number of times of output of the first signal from the first circuit matches the number of times of output of the second signal from the first circuit.

14. The reception device according to claim 13, wherein the current control circuit comprises:
a first current source configured to control a current to be supplied to the current controlled oscillation circuit based on the number of times of output of the first signal and the number of times of output of the second signal,
a second current source configured to control a current to be supplied to the current controlled oscillation circuit based on the number of times of output of the first signal and the number of times of output of the second signal,
a first switching circuit configured to switch whether or not to supply the current from the first current source to the current controlled oscillation circuit based on the first signal, and
a second switching circuit configured to switch whether or not to supply the current from the second current source to the current controlled oscillation circuit based on the second signal.

15. The reception device according to claim 14, wherein
the first current source is configured to output a current larger than the current being output when the number of times of output of the first signal is larger than the number of times of output of the second signal, and to output a current smaller than the current being output when the number of times of output of the first signal is smaller than the number of times of output of the second signal, such that the number of times of output of the first signal from the first circuit matches the number of times of output of the second signal from the first circuit.

16. The reception device according to claim 13, wherein
the current control circuit is configured to control a phase of the oscillation clock by controlling the current to be supplied to the current controlled oscillation circuit.

17. A memory controller comprising:
a first interface circuit including the reception device according to claim 13,
a control circuit configured to process data output from the interface circuit; and
a second interface circuit configured to connect to a memory device and to output data processed by the control circuit to the memory device.

18. The memory controller according to claim 17, wherein
the current control circuit comprises:
a first current source configured to control a current to be supplied to the current controlled oscillation circuit based on the number of times of output of the first signal and the number of times of output of the second signal,
a second current source configured to control a current to be supplied to the current controlled oscillation circuit based on the number of times of output of the first signal and the number of times of output of the second signal, a first switching circuit configured to switch whether or not to supply the current from the first current source to the current controlled oscillation circuit based on the first signal, and a second switching circuit configured to switch whether or not to supply the current from the second current source to the current controlled oscillation circuit based on the second signal.

19. The memory controller according to claim 17, wherein the current control circuit is configured to control a phase of the oscillation clock by controlling the current to be supplied to the current controlled oscillation circuit.

* * * * *